United States Patent
Kwon et al.

(10) Patent No.: US 7,348,231 B2
(45) Date of Patent: Mar. 25, 2008

(54) METHODS OF FABRICATING SEMICONDUCTOR DEVICES HAVING INSULATING LAYERS WITH DIFFERING COMPRESSIVE STRESSES

(75) Inventors: Hyung-Shin Kwon, Gyeonggi-do (KR); Dong-Won Lee, Seoul (KR); Jun-Beom Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 110 days.

(21) Appl. No.: 11/322,440

(22) Filed: Dec. 30, 2005

(65) Prior Publication Data

US 2006/0148153 A1    Jul. 6, 2006

(30) Foreign Application Priority Data

Jan. 3, 2005    (KR)    ...................... 10-2005-0000192

(51) Int. Cl.
*H01L 21/336*    (2006.01)
*H01L 21/8234*   (2006.01)

(52) U.S. Cl. ...................... 438/197; 438/506; 438/706; 438/740; 257/E21.17; 257/E21.245; 257/E21.229; 257/E21.304; 257/E21.632

(58) Field of Classification Search ................ 438/197, 438/506, 706, 721, 663, 752, 745, 755, 740, 438/680, 692

See application file for complete search history.

(56) References Cited

U.S. PATENT DOCUMENTS 6,057,581 A * 5/2000 Doan ........................ 257/401

(Continued)

FOREIGN PATENT DOCUMENTS

JP    2002-198368    7/2002

(Continued)

OTHER PUBLICATIONS

Office Action issued by the Korean Intellectual Property Office on Aug. 29, 2006, corresponding to Korean Patent Application No. 10-2005-0000192.

(Continued)

*Primary Examiner*—David Nhu
(74) *Attorney, Agent, or Firm*—Myers Bigel Sibley & Sajovec

(57) ABSTRACT

Methods of fabricating semiconductor devices are provided. An NMOS transistor and a PMOS transistor are provided on a substrate. The NMOS transistor is positioned on an NMOS region of the substrate and the PMOS transistor is positioned on a PMOS region of the substrate. A first insulating layer is provided on the NMOS transistor. The first insulating layer has a first compressive stress. A second insulating layer is provided on the PMOS transistor. The second insulating layer has a second compressive stress and a stress relief ratio higher than a stress relief ratio of the first insulating layer. A thermal treatment process is performed on the first insulating layer and the second insulating layer such that the second compressive stress of the second insulating layer is lower than the first compressive stress of the first insulating layer. Related devices are also provided.

19 Claims, 9 Drawing Sheets

U.S. PATENT DOCUMENTS

| | | | |
|---|---|---|---|
| 6,562,703 B1 | 5/2003 | Maa et al. | |
| 6,573,172 B1 | 6/2003 | En et al. | |
| 6,825,529 B2 * | 11/2004 | Chidambarrao et al. | 257/336 |
| 7,190,036 B2 * | 3/2007 | Ko et al. | 257/374 |
| 2003/0040158 A1 * | 2/2003 | Saitoh | 438/279 |

FOREIGN PATENT DOCUMENTS

| | | |
|---|---|---|
| JP | 2003-060201 | 2/2003 |
| KR | 10-1995-0024357 | 8/1995 |
| KR | 10-1997-0053066 | 7/1997 |
| KR | 2003-0082538 A | 10/2003 |

OTHER PUBLICATIONS

English Translation of the Office Action issued by the Korean Intellectual Property Office on Aug. 29, 2006, corresponding to Korean Patent Application No. 10-2005-0000192.

* cited by examiner

METHODS OF FABRICATING SEMICONDUCTOR DEVICES HAVING INSULATING LAYERS WITH DIFFERING COMPRESSIVE STRESSES

CLAIM OF PRIORITY

This application is related to and claims priority from Korean Patent Application No. 10-2005-0000192, filed on Jan. 3, 2005, in the Korean Intellectual Property Office, the disclosure of which is hereby incorporated herein by reference as if set forth in its entirety.

FIELD OF THE INVENTION

The present invention relates to methods of fabricating semiconductor devices and related devices, and more particularly, to methods of fabricating semiconductor devices including NMOS and PMOS transistors and related devices.

BACKGROUND OF THE INVENTION

Semiconductor devices typically use discrete devices, such as metal oxide semiconductor (MOS) transistors as switching devices. Accordingly, in order to improve characteristics of semiconductor devices, high performance MOS transistors may be needed. As semiconductor devices become more highly integrated and operate at higher speeds, various approaches have been implemented to improve characteristics of these devices. In particular, since electron mobilities and holes (carriers in a channel of the MOS transistor) may directly affect drain current and switching characteristics, these factors may be considered in order to provide highly integrated, high speed semiconductor devices.

The carrier mobility in the channel of a MOS transistor may be improved by reducing the length of the channel or the thickness of the gate insulating layer. However, reduction in the channel length may result in a short channel effect, and a more complicated, expensive photolithography process may be used. Furthermore, reduction in the thickness of the gate insulating layer may result in an increase in leakage current through the gate insulating layer, causing a deterioration in device performance.

Other approaches for improving the carrier mobility in the channel include intentionally exerting compressive stress or tensile stress on a silicon substrate where the channel is subsequently formed. Details with respect to this approach are discussed, for example, in U.S. Pat. No. 6,562,703. As discussed therein, tensile strain is generated on a surface of a silicon layer by interposing a silicon germanium layer having a lattice constant larger than a silicon lattice constant between a silicon substrate and the upper silicon layer. Although the electron mobility in the tensile-strained silicon layer may be improved, the hole mobility may be detrimentally affected. In other words, although performance of an NMOS transistor may be improved, performance of a PMOS transistor may deteriorate.

Methods of improving electron mobility of an NMOS transistor as well as controlling decrease in hole mobility of a PMOS transistor is discussed in, for example, an article entitled *A 90-nm Logic Technology Featuring Strained-Silicon* (IEEE TRANSACTIONS ON ELECTRON DEVICES, Vol. 51, No. 11, p1790, November 2004) by Thompson et al. As discussed therein, methods of forming a silicon nitride layer having high compressive stress as a stress layer on the NMOS transistor and PMOS transistor and reducing a thickness of the silicon nitride layer on an upper portion of the PMOS transistor. The silicon nitride layer is used as an etch stop layer in a subsequent contact structure formation process. In this case, it may be possible to improve electron mobility of the NMOS transistor as well as to control the decrease in hole mobility of the PMOS transistor. As the thickness of the silicon nitride layer on the upper portion of the PMOS transistor decreases, compressive stress of the silicon nitride layer on the upper portion of the PMOS transistor may also decrease. Accordingly, tensile stress exerted on the PMOS transistor may be reduced, such that the decrease in hole mobility can also be reduced. However, a problem may occur during the subsequent contact structure formation process. In particular, a contact hole is formed by forming an interlayer insulating layer on the silicon nitride layer and anisotropically dry-etching the interlayer insulating layer and the silicon nitride layer. Since the silicon nitride layers formed on the upper portions of the NMOS transistor and PMOS transistor have different thicknesses, defective openings may occur in the NMOS transistor, and over-etching may occur in the PMOS transistor. Problems caused by over-etching may be more problematic where misalignment occurs during the contact hole formation.

SUMMARY OF THE INVENTION

Some embodiments of the present invention provide methods of fabricating semiconductor devices. An NMOS transistor and a PMOS transistor are provided on a substrate. The NMOS transistor is positioned on an NMOS region of the substrate and the PMOS transistor is positioned on a PMOS region of the substrate. A first insulating layer is provided on the NMOS transistor. The first insulating layer has a first compressive stress. A second insulating layer is provided on the PMOS transistor. The second insulating layer has a second compressive stress and a stress relief ratio higher than a stress relief ratio of the first insulating layer. A thermal treatment process is performed on the first insulating layer and the second insulating layer such that the second compressive stress of the second insulating layer is lower than the first compressive stress of the first insulating layer.

In further embodiments of the present invention, the first insulating layer may include a high temperature high density plasma (HDP) oxide layer and the second insulating layer may include a low temperature HDP oxide layer. The high temperature HDP oxide layer may be formed at a temperature of from about 500° C. to about 800° C. The low temperature HDP oxide layer may be formed at a temperature of from about 200° C. to about 500° C. The first and second insulating layers may have a thickness of about 500 nm.

In still further embodiments of the present invention, the second compressive stress of the second insulating layer is substantially equal to or smaller than that of the first compressive stress of the first insulating layer.

In some embodiments of the present invention, a first insulating material layer may be provided on the NMOS transistor and the PMOS transistor and the first insulating material layer may be patterned to provide the first insulating layer. Similarly, a second insulating material layer may be provided on the first insulating layer and a chemical mechanical polishing (CMP) process may be performed on the second insulating material layer such that at least a portion of the first insulating layer is exposed.

In further embodiments of the present invention, the thermal treatment process may be performed at a temperature of from about 600° C. to about 1000° C. The thermal treatment process may be performed in an oxygen ambient.

In still further embodiments of the present invention, a conformal etch stop layer may be provided on the NMOS transistor and the PMOS transistor. The conformal etch stop layer may include a silicon oxide nitride layer and/or a silicon nitride layer. The etch stop layer may have a thickness of from about 30 nm to about 100 nm.

In some embodiments of the present invention, a first insulating material layer may be provided on the NMOS transistor and the PMOS transistor. The first insulating material layer may etched such that at least a portion of the etch stop layer of the PMOS region is exposed.

In still further embodiments of the present invention, the PMOS transistor may include a source region and a drain region on the substrate and spaced apart from each other. A gate electrode may be provided on an upper portion of the substrate between the source and the drain regions. The etch stop layer may be recessed by a predetermined thickness during the forming of the first insulating layer.

Although embodiments of the present invention are discussed above with respect to methods of forming semiconductor devices, related semiconductor devices are also provided herein.

DETAILED DESCRIPTION OF EMBODIMENTS OF THE PRESENT INVENTION

Figure 1:
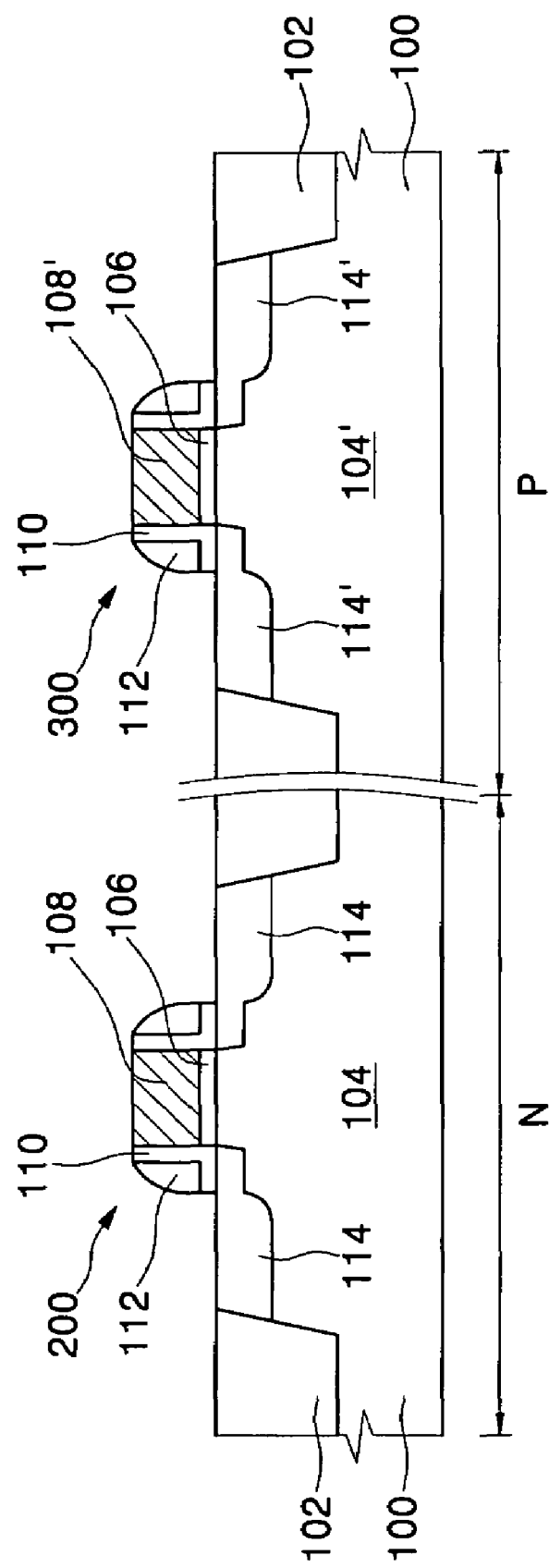
FIGS. 1 to 7 are cross sections illustrating processing steps in the fabrication of semiconductor devices according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 through 7 are cross sections illustrating processing steps in the fabrication of semiconductor devices according to some embodiments of the present invention. It will be understood that the reference numeral "N" denotes an NMOS region, and reference numeral "P" denotes a PMOS region in FIGS. 1 through 7.

Referring first to FIG. 1, a semiconductor substrate 100 having an NMOS region N and a PMOS region P is provided. In some embodiments of the present invention, the semiconductor substrate 100 may be, for example, a single crystal silicon substrate. The semiconductor substrate 100 may be a P type semiconductor substrate doped with a first conductivity type, for example, P type, impurities. CMOS integrated circuit fabrication processes are performed on the semiconductor substrate 100 to form an NMOS transistor 200 and a PMOS transistor 300. More specifically, an element isolation layer 102 is formed on the semiconductor substrate 100 to form an NMOS active region 104 and a PMOS active region 104'. A gate insulating layer 106 and a gate conductive layer (not shown) are sequentially formed on the semiconductor substrate 100 having the element isolation layer 102. The gate insulating layer 106 may include, for example, a silicon oxide layer, a silicon oxide nitride layer, or a high-k dielectric layer. An ion implantation process using a mask may be performed to implant N type impurities and P type impurities into the gate conductive layers of the NMOS region N and the PMOS region P, respectively. The gate conductive layers are patterned to form an NMOS gate electrode 108 and a PMOS gate electrode 108' on the NMOS active region 104 and the PMOS active region 104', respectively.

A first ion implantation process is performed on low concentration impurity regions in the NMOS active region 104 and the PMOS active region 104', respectively, and inner spacers 110 and outer spacers 112 on sidewalls of the gate electrodes 108 and 108' are formed. In particular, a conformal inner insulating layer and an outer insulating layer are sequentially formed on the semiconductor substrate having the gate electrodes 108 and 108'. The inner insulating layer may include, for example, a thermal oxide layer. Furthermore, the outer insulating layer may include, for example, a silicon nitride layer. The surfaces of the outer insulating layer and the inner insulating layer are sequentially anisotropically etched to form the inner spacers 110 and the outer spacers 112. A second ion implantation process is performed to provide N type source/drain regions 114 and P type source/drain regions 114' in the NMOS active region 104 and the PMOS active region 104', respectively. The second ion implantation process may be performed with a dose higher than that of the first ion implantation process.

Figure 2:
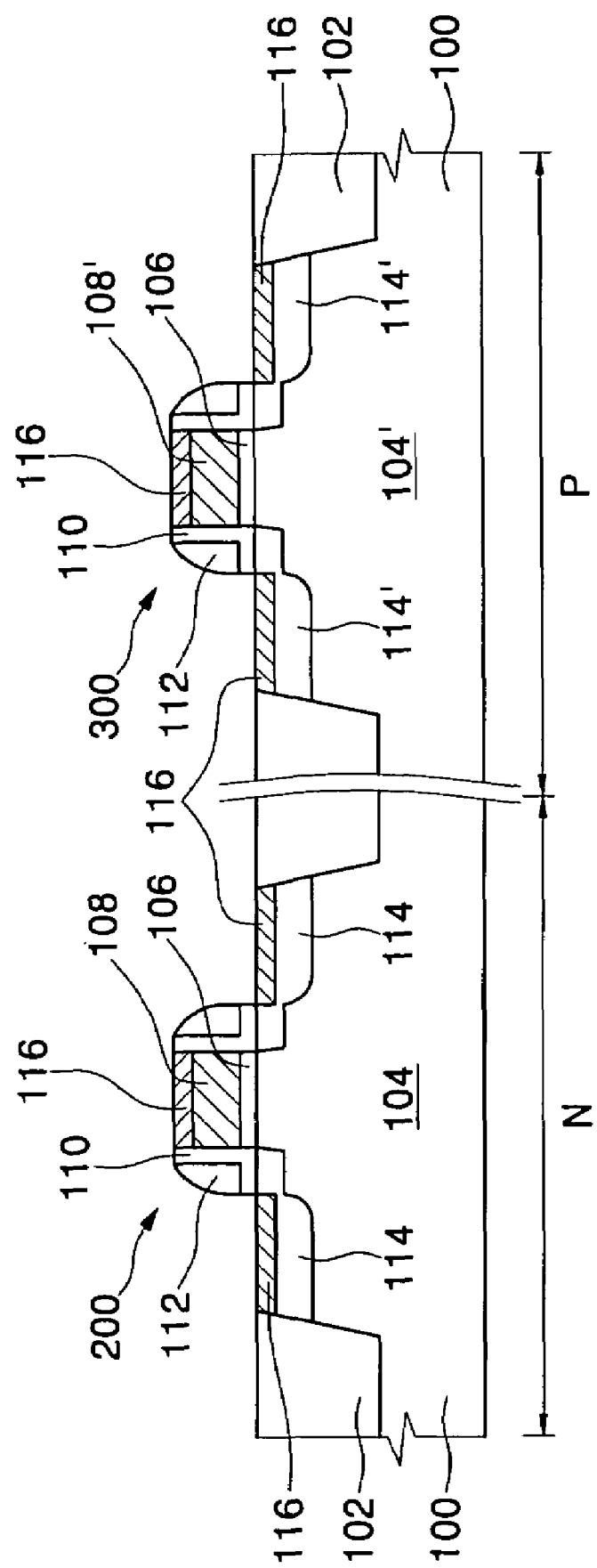

Referring now to FIG. 2, metal silicide layers 116 are formed on the source/drain regions 114 and 114' and the gate electrodes 108 and 108'. The metal silicide layers 116 may include, for example, a nickel silicide layer, a cobalt silicide layer, or a titanium silicide layer and may formed using, for example, a silicide process.

In embodiments of the present invention where the metal silicide layers 116 include cobalt silicide layers, the cobalt silicide layers may be formed using, for example, the following process. A cobalt layer is formed on the surface of a resultant product shown in FIG. 1. A first thermal treatment process is performed on the semiconductor substrate 100 having the cobalt layer at a temperature of from about 400° C. to about 500° C. As a result, a cobalt monosilicide layers (CoSi layer) is formed on source/drain regions 114 and 114' and the gate electrodes 108 and 108' due to a silicide reaction of cobalt and silicon. A non-reacted cobalt layer is removed using, for example, a wet etching process, and a second thermal treatment process is performed at a temperature of from about 750° C. to about 850° C. Accordingly, the cobalt monosilicide layers are phase-transitioned into a cobalt di-silicide layers ($CoSi_2$ layer) having low resistance.

Figure 3:
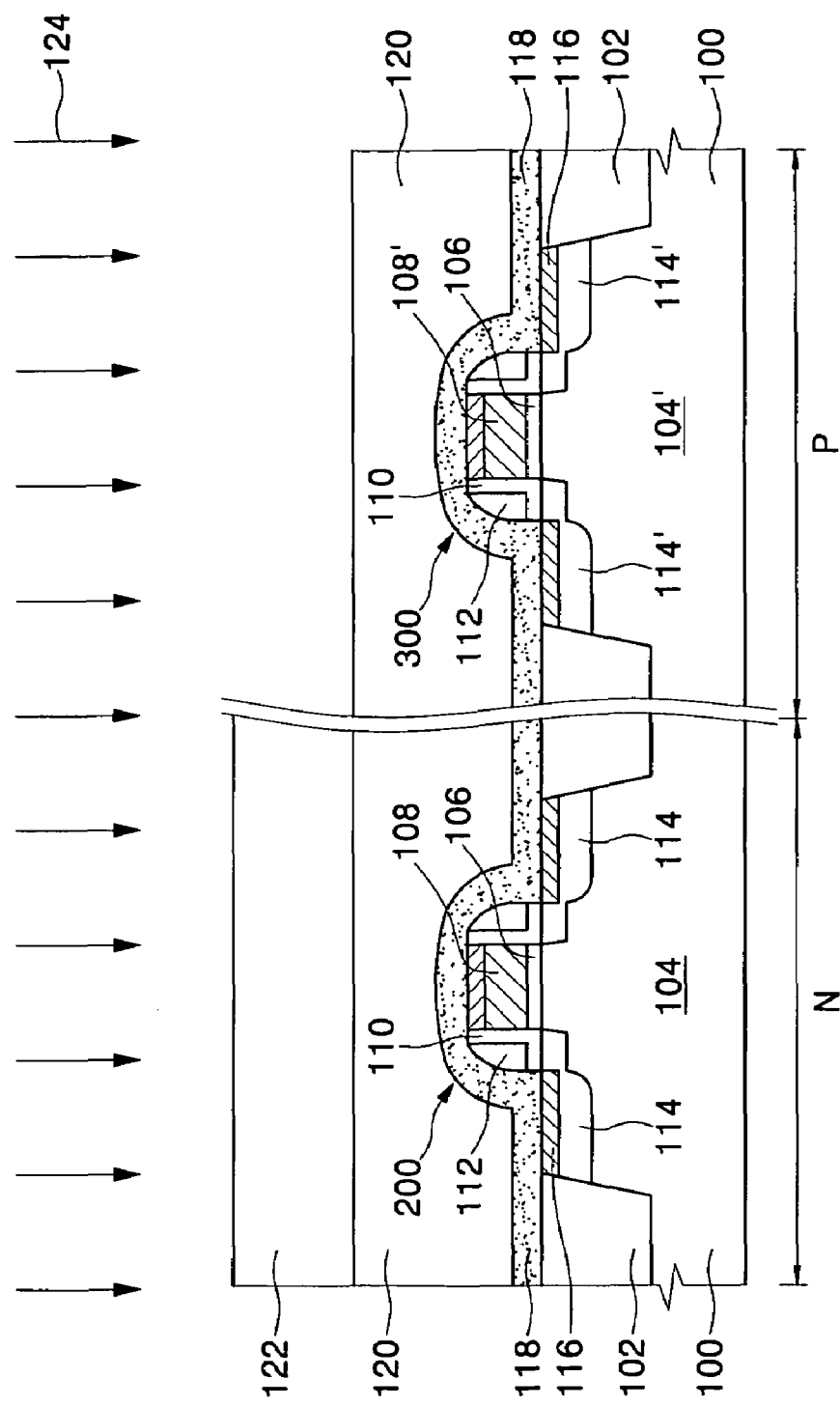

Referring now to FIG. 3, an etch stop layer 118 is formed on the surface of the semiconductor substrate 100 having the metal silicide layers 116. The etch stop layer 118 may include, for example, a silicon nitride layer, a silicon oxide nitride layer, or a stacked layer thereof. The etch stop layer 118 formed on the silicon substrate 100 generally has compressive stress due to a thermal expansion coefficient lower than that of the silicon substrate 100 and a lattice constant larger than a silicon lattice constant. Therefore, the etch stop layer 118 can exert tensile stress on the silicon substrate. In some embodiments of the present invention, the etch stop layer 118 may have a thickness that is sufficient to protect a surface of the semiconductor substrate 100 during a subsequent etching process and reduce the tensile stress exerted on the semiconductor substrate 100. The sufficient thickness of the etch stop layer 118 may be from about 30 nm to about 100 nm.

In some embodiments of the present invention where the etch stop layer 118 is formed with a stacked layer of the silicon oxide nitride layer and the silicon nitride layer, the silicon oxide nitride layer may be formed before the second thermal treatment process of the aforementioned silicide process. In particular, after the non-reacted cobalt layer is removed, the silicon oxide nitride layer is formed. After the second thermal treatment process is preformed, the silicon nitride layer may be formed on the silicon oxide nitride layer. In these embodiments of the present invention, the silicon oxide nitride layer may function as an etch stop layer and may suppress excessive increase in the thickness of the cobalt silicide layers during the silicide process.

After the etch stop layer 118 is formed, a first insulating material layer 120 is formed on the surface of the semiconductor substrate having the etch stop layer 118. The first insulating material layer 120 may be formed with an insulating layer having compressive stress, for example, a silicon oxide layer. In some embodiments of the present invention, the first insulating material layer 120 may be, for example, a high temperature HDP oxide layer formed using a High Density Plasma (HDP)-Chemical Vapor Deposition (CVD) process at a temperature of about 500° C. to about 800° C. The temperature denotes a temperature of the semiconductor substrate 100 during the HDP-CVD process. An upper surface of the first insulating material layer 120 may be planarized using, for example, a planarization process, such as a chemical mechanical polishing (CMP) process. A mask pattern 122 is formed on the first insulating material layer 120. The mask pattern 122 may be formed with, for example, a photoresist pattern. The mask pattern 122 is formed on the NMOS region N and exposes at least a portion of the PMOS region P. Using the mask pattern 122 as an etching mask, the first insulating material layer 120 on the PMOS region P is anisotropically dry-etched 124 to expose the etch stop layer 118.

Figure 4:
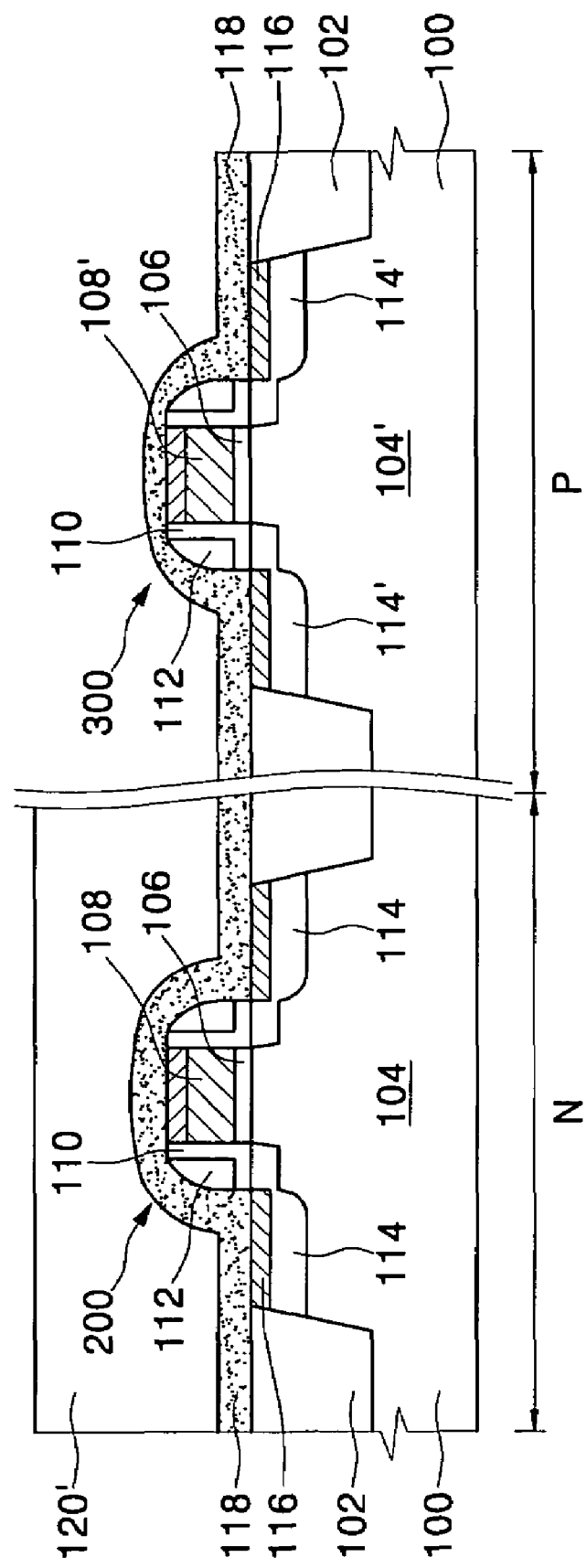

Referring now to FIG. 4, the mask pattern 122 may be removed after the anisotropic dry etching process 124 is performed. In embodiments of the present invention where the mask pattern 122 is formed with the photoresist pattern, the photoresist pattern may be removed using, for example, an etching process. As a result, a first insulating layer 120' remains on the NMOS region N. During the anisotropic dry etching process 124, the etch stop layer 118 on an upper portion of PMOS gate electrode 108' is exposed to etching environment earlier than the etch stop layer 118 on an upper portion of the PMOS source/drain region 114'. As a result, as illustrated in FIG. 4, the etch stop layer 118 formed on the upper portion of the PMOS gate electrode 108' is recessed during the anisotropic dry etching process 124, so that the etch stop layer 118 on the upper portion of the gate electrode 108' can have a reduced thickness. However, the etch stop layer 118 on the PMOS source/drain region 114' can maintain substantially the same thickness as the etch stop layer 118 on the upper portion of the NMOS region N. In these embodiments of the present invention, the etch stop layers 118 on the upper portions of the PMOS gate electrode 108' and the upper portion of the PMOS source/drain region 114' may have different thicknesses, for example, a difference of from about 100 Å to about 300 Å.

Figure 5:
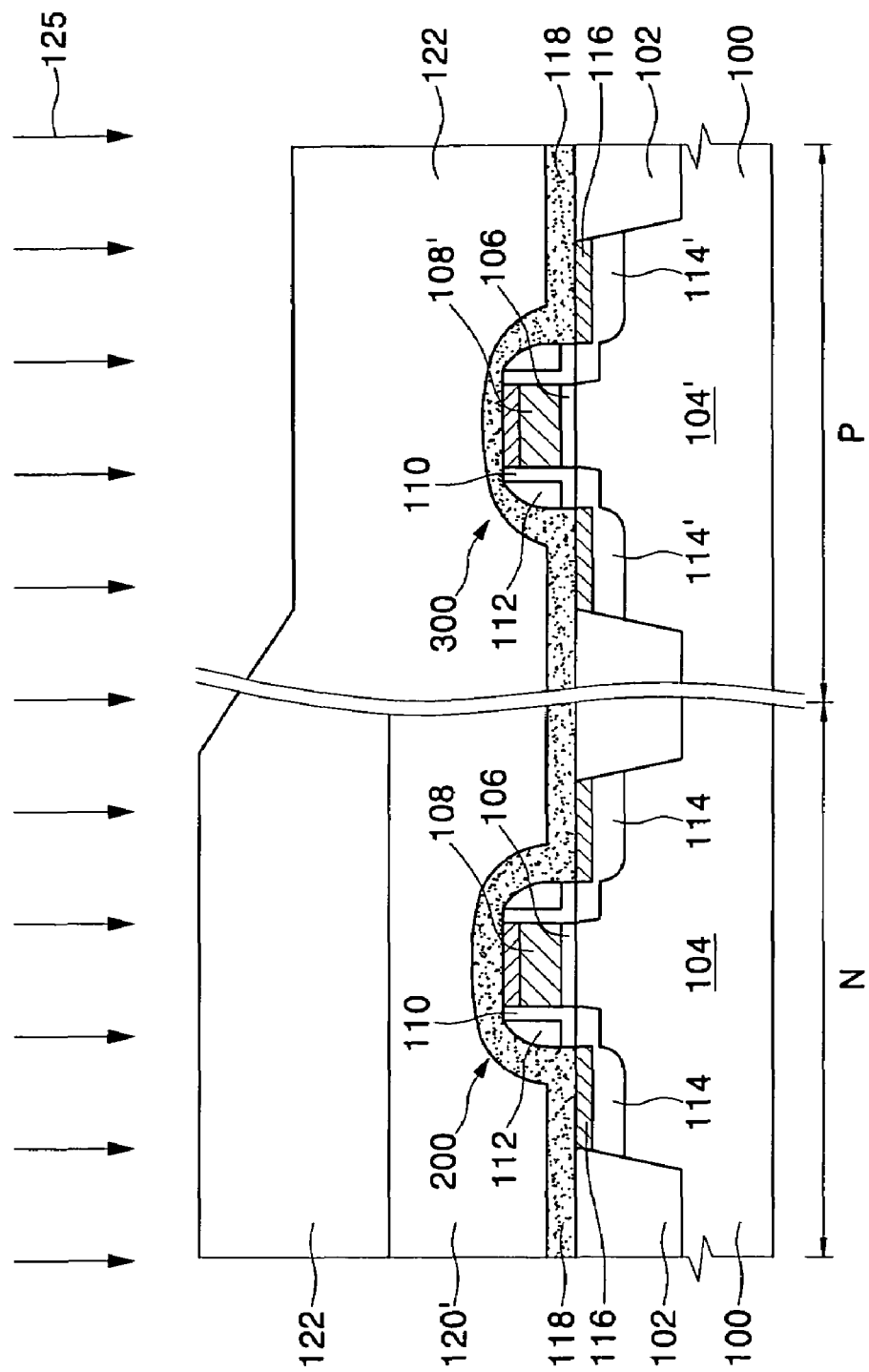

Referring now to FIG. 5, a second insulating material layer 122 is formed on the semiconductor substrate 100 having the first insulating layer 120'. The second insulating material layer 122 may be formed with an insulating layer having compressive stress and a stress relief ratio higher than that of the first insulating material layer 120, for example, a silicon oxide layer. The second insulating material layer 122 may be more stress-relieved than the first insulating material layer 120 during a stress relief process, such as a thermal treatment process, so that the second insulating layer 122 is formed with an insulating layer having a compressive stress lower than that of the first insulating material layer 120 after the stress relief process. In these embodiments of the present invention, the second insulating material layer 122 may be, for example, a silicon oxide layer having compressive stress, which is substantially the same as or smaller than that of the first insulating material layer 120. In some embodiments of the present invention, the second insulating material layer 122 may be a low temperature HDP oxide layer formed using, for example, an HDP-CVD process at a temperature of from about 200° C. to about 500° C. Here, the temperature denotes a temperature of the semiconductor substrate 100 during the HDP-CVD process. After the second insulating material layer 122 is formed, the second insulating material layer 122 is subject to a CMP process 125 to expose the first insulating layer 120'.

Figure 6:
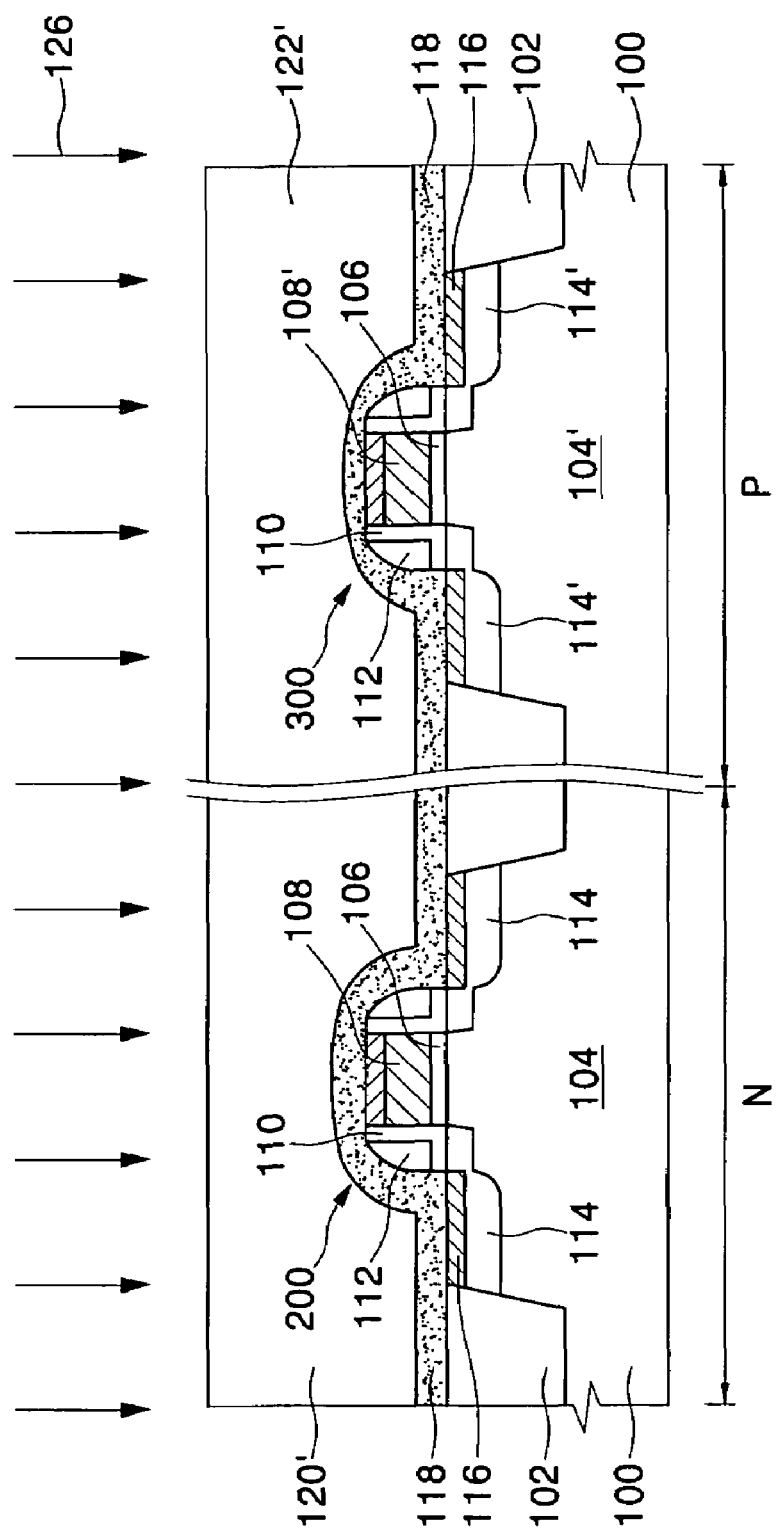

Referring now to FIG. 6, as a result of the CMP process 125, a second insulating layer 122' remains on an upper portion of the PMOS region P. In these embodiments of the present invention, after the CMP process, the first insulating layer 120' and the second insulating layer 122' may have a thickness of about 500 nm. After the second insulating layer 122' is formed, the semiconductor substrate having the first insulating layer 120' and the second insulating layer 122' is subject to a thermal treatment process 126. The thermal treatment process 126 may be performed at a temperature of from about 600° C. to about 1000° C. In addition, the thermal treatment process 126 may be performed in an oxygen ambient. During the thermal treatment process 126, compressive stress of the first insulating layer 120' and the second insulating layer 122' is relieved. The second insulating layer 122' has a stress relief ratio higher than that of the first insulating layer 120'. Therefore, the second insulating layer 122' after the thermal treatment process 126 has compressive stress lower than that of the first insulating layer 120'. Although the thermal treatment process 126 may be performed as a separate process as described above, the thermal treatment process 126 may be incorporated with various subsequent thermal treatment processes. For example, in embodiments of the present invention where an oxide capping layer is formed on upper portions of the first insulating layer 120' and the second insulating layer 122', stress relief may occur during a high temperature CVD process for forming the oxide capping layer.

As described above, according to the present invention, a first insulating layer 120' having high compressive stress is formed on an upper portion of the NMOS transistor 200, and a second insulating layer 122' having compressive stress lower than that of the first insulating layer 120' is formed on the upper portion of the PMOS transistor 300. At this time, the stress exerted on the NMOS active region 104 and the PMOS active region 104' is mainly affected by the first insulating layer 120' and the second insulating layer 122' having a thickness larger than that of the etch stop layer 118. As a result, the NMOS active region 104 is exerted by high tensile stress, so that electron mobility in a channel of the NMOS transistor 200 can be increased. Furthermore, the PMOS active region 104' is exerted by low tensile stress in comparison to the NMOS active region 104, so that decrease in hole mobility in a channel of the PMOS transistor 300 can be reduced. Therefore, according to some embodiments of the present invention, it may be possible to improve total carrier mobility in the CMOS device.

Figure 7:
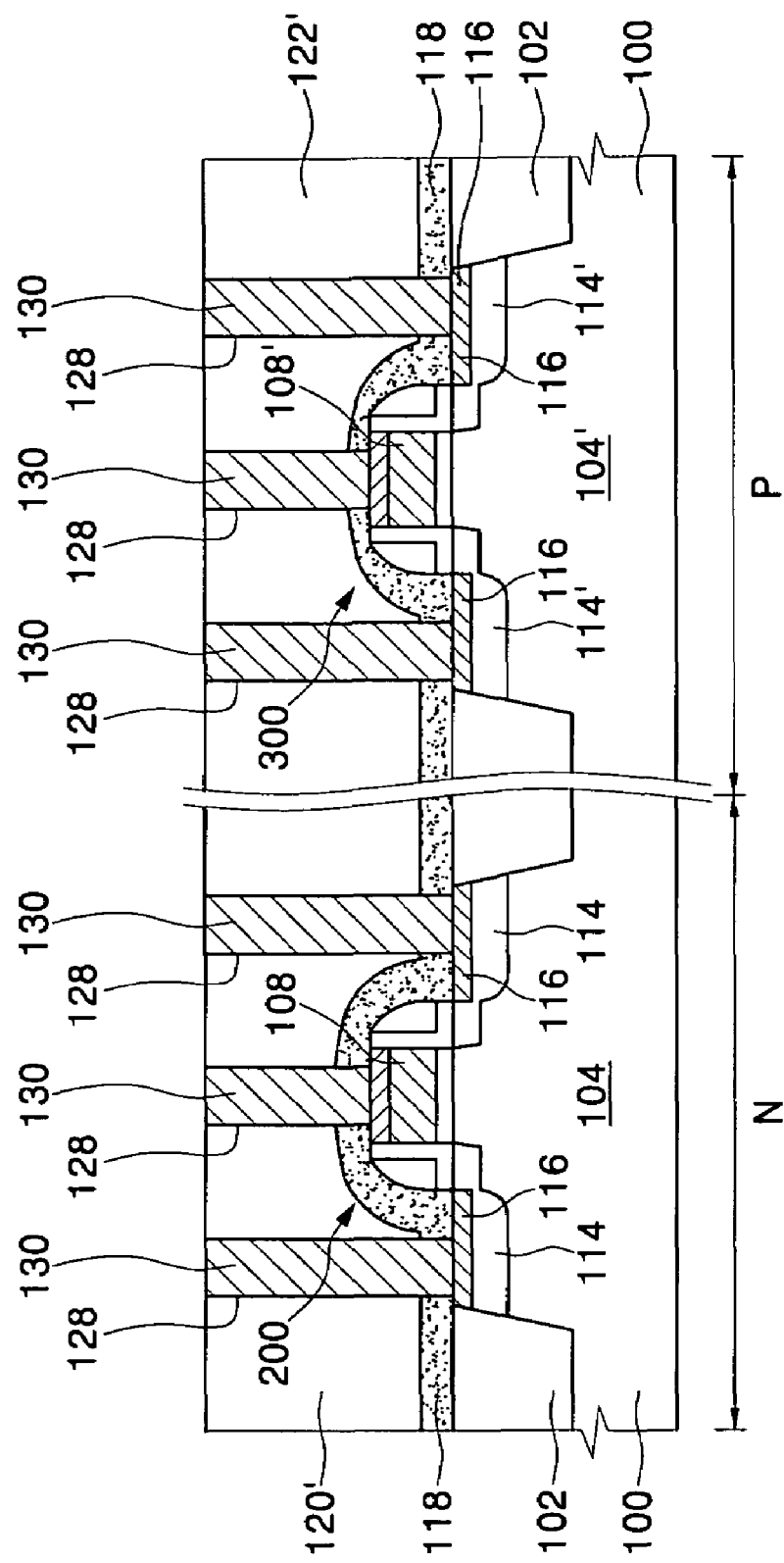

Referring now to FIG. 7, the first insulating layer 120', the second insulating layer 122', and the etch stop layer 118 are patterned to form contact holes 128 exposing the source/drain regions 114 and 114' and/or the gate electrodes 108 and 108'. As discussed above, in embodiments of the present invention where metal silicide layers 116 are formed on the source/drain regions 114 and 114' and the gate electrodes 108 and 108', the contact holes 128 can expose the metal silicide layers 116. The contact holes 128 may be formed using, for example, a photolithography process and an anisotropic dry etching process. According to some embodiments of the present invention, the etch stop layer 118 has substantially the same thickness in both of the NMOS region N and the PMOS region P. Therefore, during the anisotropic dry etching process for the first insulating layer 120', the second insulating layer 122', and the etch stop layer 118, it may be possible to reduce the likelihood of a defective opening and/or over-etching. As discussed above, since the etch stop layer 118 on the upper portion of PMOS gate electrode 108' may have a reduced thickness. However, since the metal silicide layer 116 on the PMOS gate electrode 108' has a high etching selection ratio to the second insulating layer 122', it may be possible to avoid the problem of over-etching. A metal layer is formed on the surface of a semiconductor substrate having the contact holes 128, and the metal layer is subject to a CMP process to form contact structures 130 filling the contact holes.

Experimental examples will now be discussed. In particular, after a high temperature HDP oxide layer and a low temperature HDP oxide layer are formed on NMOS transistors, electrical characteristics of the NMOS transistors are observed. In addition, a high temperature HDP oxide layer and a low temperature HDP oxide layer are formed on PMOS transistors, electrical characteristics of the PMOS transistors are observed.

The NMOS transistor and the PMOS transistor are formed using methods according to some embodiments of the present invention with process conditions shown in the following Table 1. In addition, the high temperature HDP oxide layer and the low temperature HDP oxide layer of the NMOS transistor and the PMOS transistor are formed with the same conditions as shown in Table 1. At this time, a silicon source is silane ($SiH_4$), and an oxidant is oxygen gas ($O_2$).

TABLE 1

| Process Condition | NMOS Transistor | PMOS Transistor |
|---|---|---|
| Gate Insulating Layer | silicon oxide layer SiO$_2$/16 Å | |
| Gate Electrode | N type polysilicon layer | P type polysilicon layer |
| Source/Drain | Arsenic, 5 × 10$^{15}$ atoms/cm$^2$, 40 keV | |
| Thermal Treatment | 1050° C., nitrogen ambient, rapid thermal treatment (RTP) | |
| Salicide | first thermal treatment 460° C. | |
| Cosi2 | second thermal treatment 800° C. | |
| Etch stop Layer | silicon oxide nitride layer (SiON)/ silicon nitride layer (SiN) 35 nm | |
| HDP Oxide Layer/ Thermal Treatment | high temperature HDP oxide layer (substrate temperature: 380° C.)/800° C., oxygen ambient, 1 min. low temperature HDP oxide layer (substrate temperature: 650° C.)/800° C., oxygen ambient, 1 min. | |

Compressive stresses of the high temperature HDP oxide layer and the low temperature HDP oxide layer after a deposition process and a thermal treatment process are measured. The measurement results for the NMOS transistor and the PMOS transistor are the same, and the compressive stresses of the high temperature HDP oxide layer and the low temperature HDP oxide layer measured after the deposition process before the thermal treatment process are −2.111×10$^9$ and −2.574×10$^9$, respectively. On the other hand, the compressive stresses of the high temperature HDP oxide layer and the low temperature HDP oxide layer measured after the thermal treatment process are −9.02×10$^8$ and −2.433×10$^9$, respectively. As discussed above, the compressive stresses of the high temperature HDP oxide layer and the low temperature HDP oxide layer measured before the thermal treatment process are almost the same. However, the compressive stress of the high temperature HDP oxide layer measured after the thermal treatment process is slightly reduced, while the compressive stress of the low temperature HDP oxide layer measured after the thermal treatment process is greatly reduced. It is determined that the measurement result may be caused by a deposition temperature of the HDP oxide layer and a bias power in the deposition process.

Figure 8:
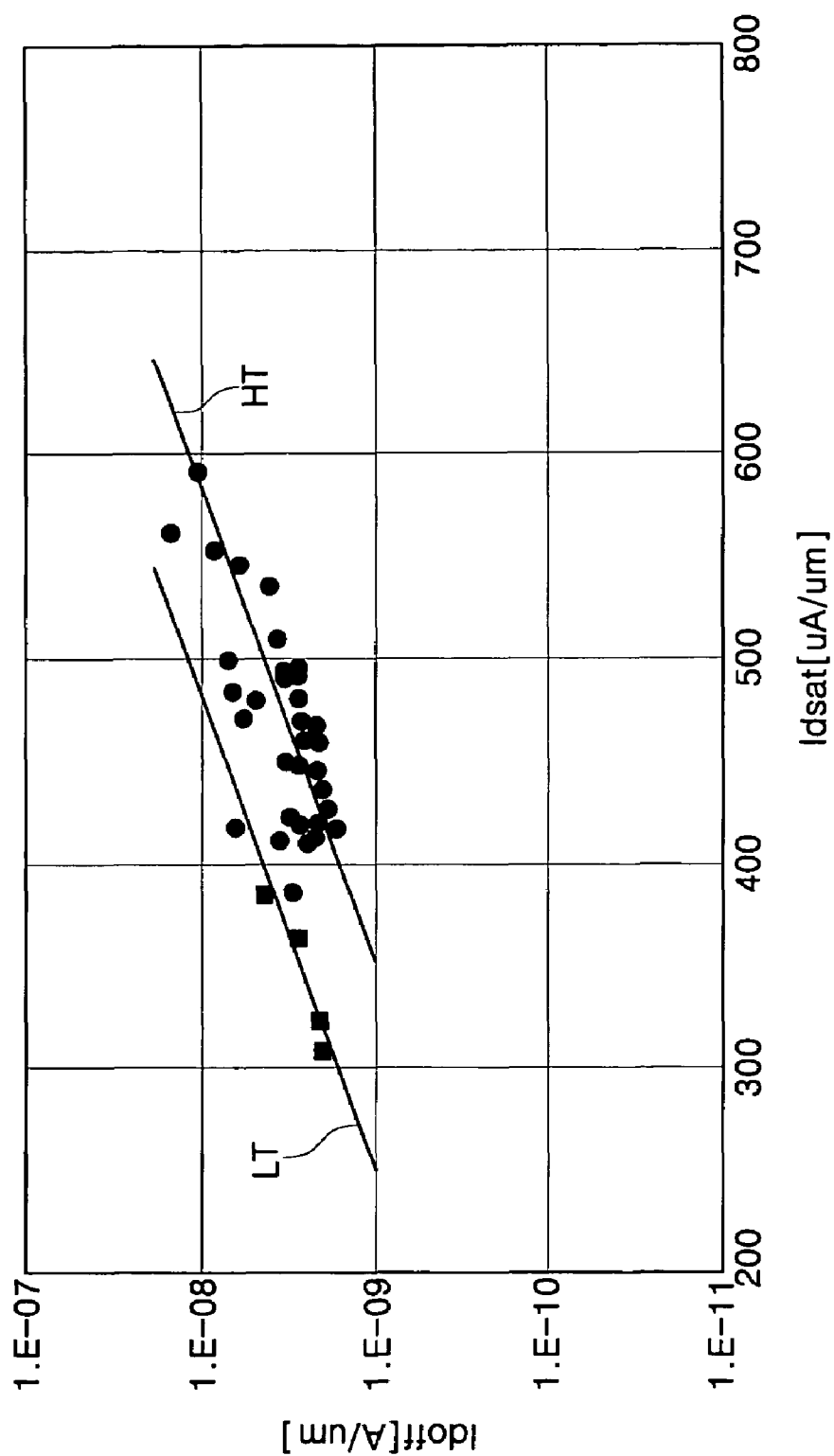
FIGS. 8 and 9 are graphs illustrating on/off current characteristics of NMOS transistors and PMOS transistors with respect to oxide layers according to some embodiments of the present invention.
Figure 9:
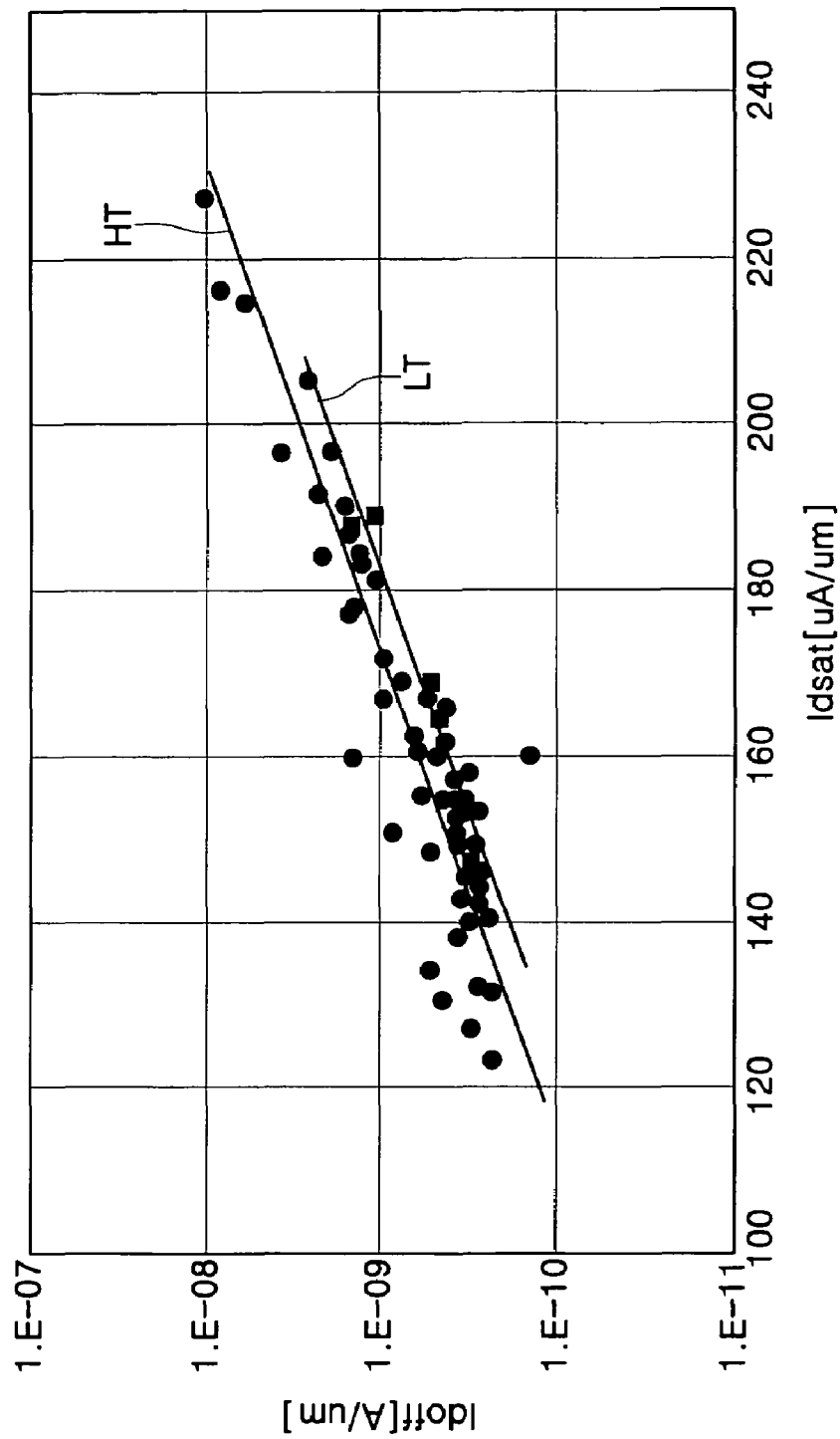

Referring now to FIGS. 8 and 9, graphs showing on/off current characteristics (a correlation of on current and off current) of an NMOS transistor and a PMOS transistor with respect to oxide layers will be discussed. The NMOS transistor, the PMOS transistor, and oxide layers thereof showing the results of FIGS. 8 and 9 are formed in accordance with the process conditions shown in Table 1. In the graphs of FIGS. 8 and 9, horizontal axes indicate drain saturation current I$_{dsat}$ per unit channel width, and vertical axes indicate drain off current I$_{doff}$ per unit channel width. The drain saturation current I$_{dsat}$ is a current flowing through a drain region in a case where a source region and a bulk region are grounded and a power supply voltage V$_{dd}$ of +1.2 V is applied to the drain region and a gate electrode. In addition, the drain off current I$_{doff}$ is a current flowing though the drain region in a case where the source region, the bulk region, and the gate electrode are grounded and the power supply voltage Vdd of +1.2 V is applied to the drain region. On the other hand, in FIG. 8, data denoted by reference symbol "■" and line "LT" show a result of a case where the low temperature HDP oxide layer is formed on the NMOS transistor, data denoted by reference symbol "●" and line "HT" shows a result of a case where the high temperature HDP oxide layer is formed on the NMOS transistor. In addition, in FIG. 9, data denoted by reference symbol "■" and line "LT" show a result of a case where the low temperature HDP oxide layer is formed on the PMOS transistor, data denoted by reference symbol "●" and line "HT" shows a result of a case where the high temperature HDP oxide layer is formed on the PMOS transistor.

Referring to FIG. 8, the NMOS transistor having the high temperature HDP oxide layer on the upper portion thereof shows large drain saturation current in comparison to the NMOS transistor having low temperature HDP oxide layer on the upper portion thereof. Namely, although subject to the thermal treatment process, the high temperature HDP oxide layer has a relatively large compressive stress in comparison to the low temperature HDP oxide layer. As a result, it can be understood that the NMOS transistor (specifically, an NMOS active region) having the high temperature HDP oxide layer on the upper portion thereof is exerted by a large tensile stress, so that electron mobility can increases.

Referring to FIG. 9, the PMOS transistor having the low temperature HDP oxide layer on the upper portion thereof shows large drain saturation current in comparison to the NMOS transistor having high temperature HDP oxide layer on the upper portion thereof. Namely, the low temperature HDP oxide layer has a relatively small compressive stress in comparison to the high temperature HDP oxide layer after the thermal treatment process. It can be understood that the PMOS transistor (specifically, a PMOS active region) having the low temperature HDP oxide layer on the upper portion thereof is exerted by a relatively small tensile stress, so that decrease in hole mobility due to the tensile stress can be suppressed.

The results of FIGS. 8 and 9 show that, according to some embodiments of the present invention, it may be possible to improve the electron mobility in the NMOS transistor and to minimize the decrease in the hole mobility in the PMOS transistor by forming the first insulating layer 120' having large compressive stress on the upper portion of the NMOS transistor 200 and forming the second insulating layer 122' having small compressive stress on the upper portion of the PMOS transistor 300.

As described above, according to some embodiments of the present invention, it may be possible to improve electron mobility in an NMOS transistor and to reduce the likelihood that the hole mobility in a PMOS transistor may decrease by forming a first insulating layer 120' having large compressive stress on an upper portion of the NMOS transistor and forming a second insulating layer 122' having small compressive stress on an upper portion of the PMOS transistor.

In addition, according to some embodiments of the present, it may be possible to prevent defective opening and/or over-etching during the formation of a contact structure by equalizing thicknesses of etch stop layers formed on upper portions of the NMOS transistor and the PMOS transistor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a semiconductor device, the method comprising:

forming an NMOS transistor and a PMOS transistor on a substrate, the NMOS transistor being positioned on an NMOS region of the substrate and the PMOS transistor being positioned on a PMOS region of the substrate;

forming a first insulating layer on the NMOS transistor, the first insulating layer having a first compressive stress;

forming a second insulating layer on the PMOS transistor, the second insulating layer having a second compressive stress and a stress relief ratio higher than a stress relief ratio of the first insulating layer; and performing a thermal treatment process on the first insulating layer and the second insulating layer such that the second compressive stress of the second insulating layer is lower than the first compressive stress of the first insulating layer.

2. The method of claim 1:
wherein forming the first insulating layer comprises forming a high temperature high density plasma (HDP) oxide layer; and
wherein forming the second insulating layer comprises forming a low temperature HDP oxide layer.

3. The method of claim 2, wherein forming the high temperature HDP oxide layer comprises forming the high temperature HDP oxide layer at a temperature of from about 500° C. to about 800° C.

4. The method of claim 2, wherein forming the low temperature HDP oxide layer comprises forming the low temperature HDP oxide layer at a temperature of from about 200° C. to about 500° C.

5. The method of claim 1:
wherein forming the first insulating layer comprises forming the first insulating layer having a thickness of about 500 nm; and
wherein forming the second insulating layer comprises forming the second insulating layer having a thickness of about 500 nm.

6. The method of claim 1, wherein the second compressive stress of the second insulating layer is substantially equal to or smaller than that of the first compressive stress of the first insulating layer.

7. The method of claim 1, wherein forming the first insulating layer comprises:
forming a first insulating material layer on the NMOS transistor and the PMOS transistor; and
patterning the first insulating material layer.

8. The method of claim 1, wherein forming the second insulating layer comprises:
forming a second insulating material layer on the first insulating layer; and
performing a chemical mechanical polishing (CMP) process on the second insulating material layer such that at least a portion of the first insulating layer is exposed.

9. The method of claim 1, wherein the thermal treatment process is performed at a temperature of from about 600° C. to about 1000° C.

10. The method of claim 9, wherein the thermal treatment process is performed in an oxygen ambient.

11. The method of claim 1, wherein the step of forming the first insulating layer is preceded by forming a conformal etch stop layer on the NMOS transistor and the PMOS transistor.

12. The method of claim 11, wherein forming the conformal etch stop layer comprises forming a silicon oxide nitride layer and/or a silicon nitride layer.

13. The method of claim 11, wherein forming the conformal etch stop layer comprises forming a conformal etch stop layer having a thickness of from about 30 nm to about 100 nm.

14. The method of claim 11, wherein the forming the first insulating layer comprises:
forming a first insulating material layer on the NMOS transistor and the PMOS transistor; and
etching the first insulating material layer such that at least a portion of the conformal etch stop layer of the PMOS region is exposed.

15. The method of claim 11:
wherein the PMOS transistor comprises:
a source region and a drain region on the substrate and spaced apart from each other; and
a gate electrode on an upper portion of the substrate between the source and the drain regions; and
wherein the conformal etch stop layer is recessed by a predetermined thickness during the forming of the first insulating layer.

16. A method of fabricating a semiconductor device, the method comprising:
forming an NMOS transistor and a PMOS transistor on a substrate, the NMOS transistor being positioned on an NMOS region of the substrate and the PMOS transistor being positioned on a PMOS region of the substrate;
forming a first insulating layer on the NMOS transistor;
forming a second insulating layer on the PMOS transistor; and
performing a thermal treatment process on the first insulating layer and the second insulating layer such that a compressive stress of the second insulating layer is lower than a compressive stress of the first insulating layer,
wherein the first insulating layer entirely covers the NMOS transistor and the second insulating layer entirely covers the PMOS transistor.

17. The method of claim 16: wherein a top surface of the first insulating layer is substantially planar.

18. The method of claim 16: wherein a top surface of the second insulating layer is substantially planar.

19. The method of claim 16, wherein the step of forming the first insulating layer is preceded by forming a conformal etch stop layer on the NMOS transistor and the PMOS transistor.

* * * * *